US012647108B2

(12) United States Patent
Sasaki

(10) Patent No.: US 12,647,108 B2
(45) Date of Patent: Jun. 2, 2026

(54) SEMICONDUCTOR DEVICE AND DELAY CONTROL METHODS

(71) Applicant: Renesas Electronics Corporation, Tokyo (JP)

(72) Inventor: Yasuo Sasaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 255 days.

(21) Appl. No.: 18/512,870

(22) Filed: Nov. 17, 2023

(65) Prior Publication Data

US 2024/0171164 A1      May 23, 2024

(30) Foreign Application Priority Data

Nov. 18, 2022     (JP) .................................. 2022-185334

(51) Int. Cl.
| | |
|---|---|
| *H03K 5/01* | (2006.01) |
| *H04L 1/00* | (2006.01) |
| *H03K 5/00* | (2006.01) |

(52) U.S. Cl.
CPC ............. *H03K 5/01* (2013.01); *H04L 1/0061* (2013.01); *H03K 2005/00019* (2013.01)

(58) Field of Classification Search
CPC ................................ H03K 5/01; H04L 1/0061
USPC ............................................................ 713/1
See application file for complete search history.

(56) References Cited

U.S. PATENT DOCUMENTS

| | | | | | |
|---|---|---|---|---|---|
| 5,519,603 | A | * | 5/1996 | Allbery, Jr. ............... | G05B 9/03 |
| | | | | | 714/E11.06 |
| 6,101,612 | A | * | 8/2000 | Jeddeloh ............. | G06F 13/1689 |
| | | | | | 713/401 |
| 6,294,937 | B1 | * | 9/2001 | Crafts ................. | G06F 13/4226 |
| | | | | | 327/158 |
| 6,483,361 | B1 | * | 11/2002 | Chiu ..................... | H03L 7/0891 |
| | | | | | 331/DIG. 2 |
| 9,716,508 | B1 | * | 7/2017 | Zhang ................. | H03M 1/0678 |
| 2002/0087922 | A1 | * | 7/2002 | Glenn ....................... | H04L 7/02 |
| | | | | | 714/700 |
| 2002/0153929 | A1 | * | 10/2002 | Yoo ....................... | H03L 7/0818 |
| | | | | | 327/158 |
| 2002/0169922 | A1 | * | 11/2002 | Thomann ............... | G11C 29/50 |
| | | | | | 711/100 |

(Continued)

FOREIGN PATENT DOCUMENTS

JP          2014-045266 A       3/2014

*Primary Examiner* — Paul R. Myers

(74) *Attorney, Agent, or Firm* — Rimon P.C.

(57) ABSTRACT

A technique capable of improving accuracy of an amount of delay of a sampling clock is provided. A semiconductor device includes: a communication device for wired communication; a delay adder circuit capable of adjusting an amount of delay of a clock to be received or transmitted by the communication device; and a control circuit controlling the amount of delay of the delay adder circuit. The communication device is configured to set a reception period or a transmission period of a normal frame and a reception period or a transmission period of a check frame in time division, and to confirm timing margins of setup and hold between data and a clock in the reception period or the transmission period of the check frame. The control circuit is configured to set the amount of delay in the normal frame, based on a confirmation result of the timing margins.

9 Claims, 15 Drawing Sheets

(56)             References Cited

U.S. PATENT DOCUMENTS

| | | | |
|---|---|---|---|
| 2003/0051086 A1* | 3/2003 | Smith | H02H 1/00 |
| | | | 714/E11.154 |
| 2003/0084195 A1* | 5/2003 | Dove | H04L 12/40013 |
| | | | 370/258 |
| 2003/0103429 A1* | 6/2003 | Senshu | G11B 7/007 |
| | | | 369/47.24 |
| 2003/0169084 A1* | 9/2003 | Gomm | H03L 7/0814 |
| | | | 327/158 |
| 2006/0164266 A1* | 7/2006 | Riedel | H04N 21/8547 |
| | | | 375/E7.278 |
| 2007/0006053 A1* | 1/2007 | Otto | H04L 25/14 |
| | | | 714/700 |
| 2007/0089009 A1* | 4/2007 | Nishizawa | G01R 31/31715 |
| | | | 714/738 |
| 2007/0097264 A1* | 5/2007 | Risk | H04L 7/10 |
| | | | 348/552 |
| 2007/0217559 A1* | 9/2007 | Stott | H04L 7/0008 |
| | | | 375/355 |
| 2008/0101139 A1* | 5/2008 | Wilson | G11C 7/222 |
| | | | 365/193 |
| 2010/0320991 A1* | 12/2010 | Yoshino | H02M 3/156 |
| | | | 323/288 |
| 2012/0044003 A1* | 2/2012 | Itou | H04L 25/14 |
| | | | 327/160 |
| 2015/0206273 A1* | 7/2015 | Jeon | G09G 5/006 |
| | | | 348/521 |
| 2015/0207617 A1* | 7/2015 | Usuda | H03L 7/08 |
| | | | 375/376 |
| 2015/0311904 A1* | 10/2015 | Sasaki | G06F 1/10 |
| | | | 327/156 |
| 2017/0033955 A1* | 2/2017 | Natarajan | H04L 25/49 |

* cited by examiner

| S_time | E_time | a[1:0] | RXIF_P |
|--------|--------|--------|--------|
| ta0[n] | ta1[n] | 10b | P1 |
| ta1[n] | ta2[n] | 00b | P3 |
| ta2[n] | ta3[n] | 11b | P2 |
| ta3[n] | ta0[n+1] | 00b | P3 |

Figure 7:
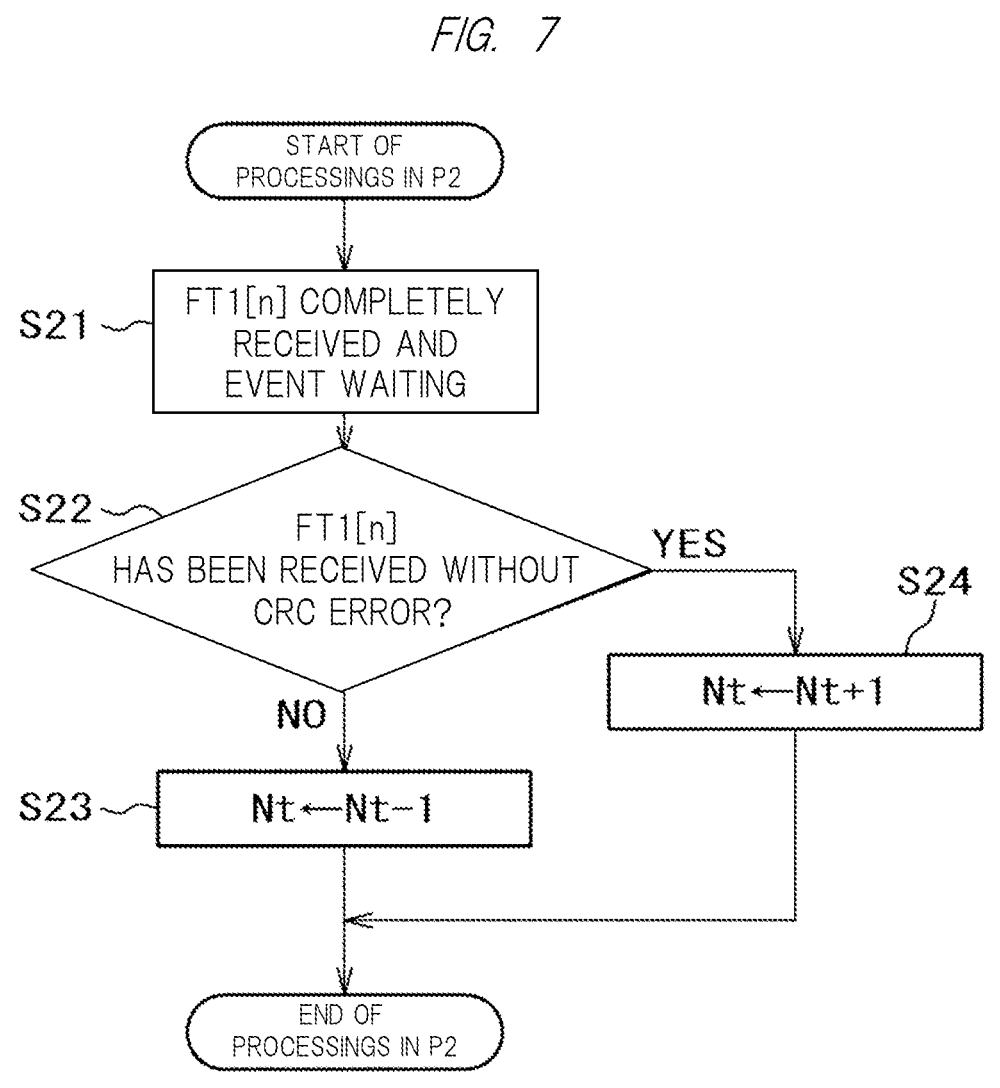

```
        ┌──────────────────────┐
        │      START OF        │
        │  PROCESSINGS IN P2   │
        └──────────────────────┘
                  │
                  ▼
        ┌──────────────────────┐
S21     │  FT1[n] COMPLETELY   │
        │   RECEIVED AND       │
        │   EVENT WAITING      │
        └──────────────────────┘
                  │
                  ▼
S22         ◇ FT1[n]                      YES    ┌──────────────┐
        HAS BEEN RECEIVED WITHOUT ──────────────▶│ S24          │
              CRC ERROR? ◇                        │  Nt←Nt+1     │
                  │                               └──────────────┘
                 NO                                      │
                  ▼                                      │
        ┌──────────────┐                                 │
S23     │   Nt←Nt-1    │                                 │
        └──────────────┘                                 │
                  │◀───────────────────────────────────────
                  ▼
        ┌──────────────────────┐
        │      END OF          │
        │  PROCESSINGS IN P2   │
        └──────────────────────┘
```

| S_time | E_time | b[1:0] | RXIF_P | TXIF_P |
|--------|--------|--------|--------|--------|
| tb0[n] | tb1[n] | 10b | P1 | P2a |
| tb1[n] | tb2[n] | 01b | P2b | — |
| tb2[n] | tb3[n] | 00b | P3 | P3 |
| tb3[n] | tb4[n] | 11b | P2 | P1a |
| tb4[n] | tb5[n] | 01b | P1b | — |
| tb5[n] | tb0[n+1] | 00b | P3 | P3 |

*FIG. 11*

| S_time | E_time | TXIF_P | RXIF_P |
|--------|--------|--------|--------|
| tb0[n] | tb1[n] | P1 | P2a |
| tb1[n] | tb2[n] | P2b | — |
| tb2[n] | tb3[n] | P3 | P3 |
| tb3[n] | tb4[n] | P2 | P1a |
| tb4[n] | tb5[n] | P1b | — |
| tb5[n] | tb0[n+1] | P3 | P3 |

Figure 16:
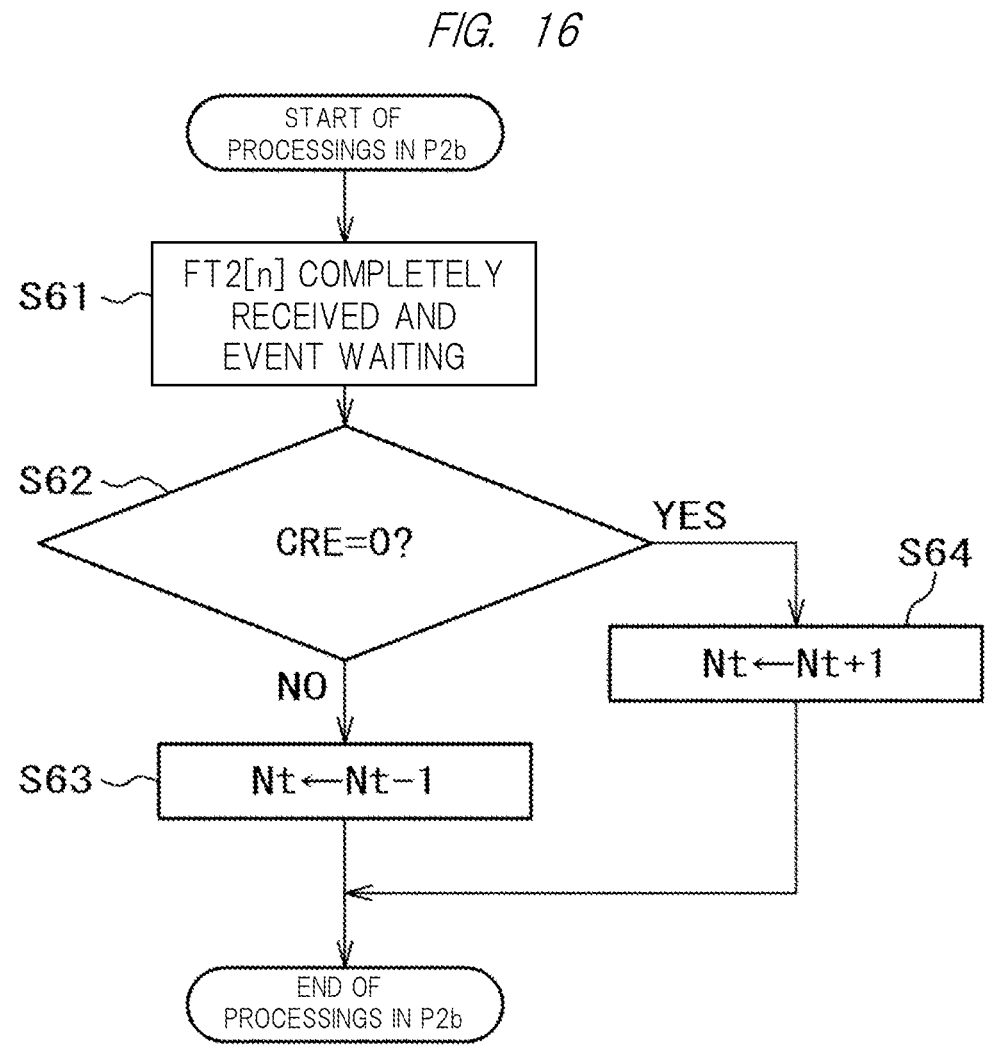

```
        ┌──────────────────────┐
        │      START OF         │
        │  PROCESSINGS IN P2b   │
        └──────────┬───────────┘
                   │
                   ▼
        ┌──────────────────────┐
        │   FT2[n] COMPLETELY   │
 S61 ───│    RECEIVED AND       │
        │    EVENT WAITING      │
        └──────────┬───────────┘
                   │
                   ▼
                ◇ S62
          CRE=0?  ──── YES ────┐
                                │
                                ▼  S64
               NO          ┌─────────────┐
                │          │  Nt ← Nt+1  │
                ▼          └──────┬──────┘
        ┌─────────────┐          │
 S63 ───│  Nt ← Nt−1  │          │
        └──────┬──────┘          │
               │◄─────────────────┘
               ▼
        ┌──────────────────────┐
        │      END OF           │
        │  PROCESSINGS IN P2b   │
        └──────────────────────┘
```

<u>10</u>

1

SEMICONDUCTOR DEVICE AND DELAY CONTROL METHODS

CROSS-REFERENCE TO RELATED APPLICATION

The disclosure of Japanese Patent Application No. 2022-185334 filed on Nov. 18, 2022, including the specification, drawings and abstract is incorporated herein by reference in its entirety.

BACKGROUND

The present disclosure relates to a semiconductor device, and is applicable to, for example, a semiconductor device sampling data, based on a clock.

Sensitivities for variations in Process-Voltage-Temperature (PVT) have increased due to miniaturization of semiconductor processes. Thus, it is desirable to increase timing margins as large as possible.

There is disclosed technique listed below.

[Patent Document 1] Japanese Unexamined Patent Application Publication No. 2014-45266

Japanese Unexamined Patent Application Publication No. 2014-45266 (the Patent Document 1) discloses that a phase shift (time) between a reception signal and a sampling clock is measured on the basis of the amount of charges charged in capacitors, and discloses that the amount of delay of the sampling clock is adjusted on the basis of the measured phase shift.

In the technique disclosed in the Patent Document 1, a phase is estimated in an analog manner by use of the amount of charges accumulated in capacitors, and thus it is difficult to provide the sufficient accuracy in the measured phase shift.

Other problems and novel characteristics will become apparent from the description of the present specification and the drawings.

SUMMARY

An outline of a typical aspect of the present disclosure will be briefly described as follows. That is, a semiconductor device includes: a communication device for wired communication; a delay adder circuit capable of adjusting an amount of delay of a clock to be received from or transmitted to the communication device; and a control circuit controlling the amount of delay of the delay adder circuit. The communication device is configured to set a reception period or a transmission period of a normal frame and a reception period or a transmission period of a check frame in time division, and to confirm timing margins of setup and hold between data and a clock in the reception period or the transmission period of the check frame. The control circuit is configured to set the amount of delay in the normal frame, based on a confirmation result of the timing margins.

According to the semiconductor device, accuracy of the amount of delay of the sampling clock can be improved.

BRIEF DESCRIPTIONS OF THE DRAWINGS

FIG. 2 is a block diagram of a configuration of a control circuit of FIG. 1.

Figures 2, 3:
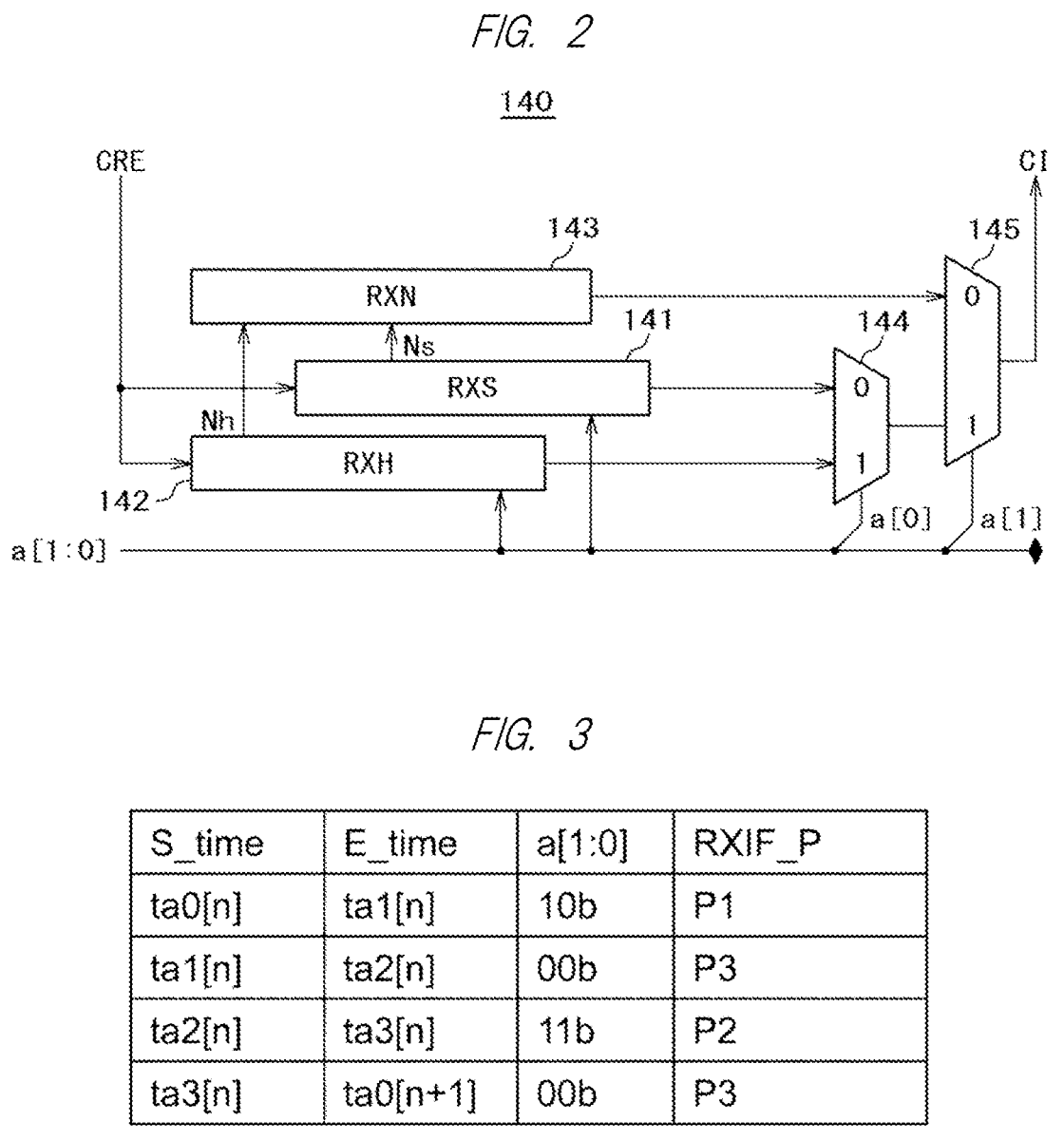

FIG. 3 is a diagram of exemplary settings of time of a timer, a control signal, and a reception interface period.

Figure 4:
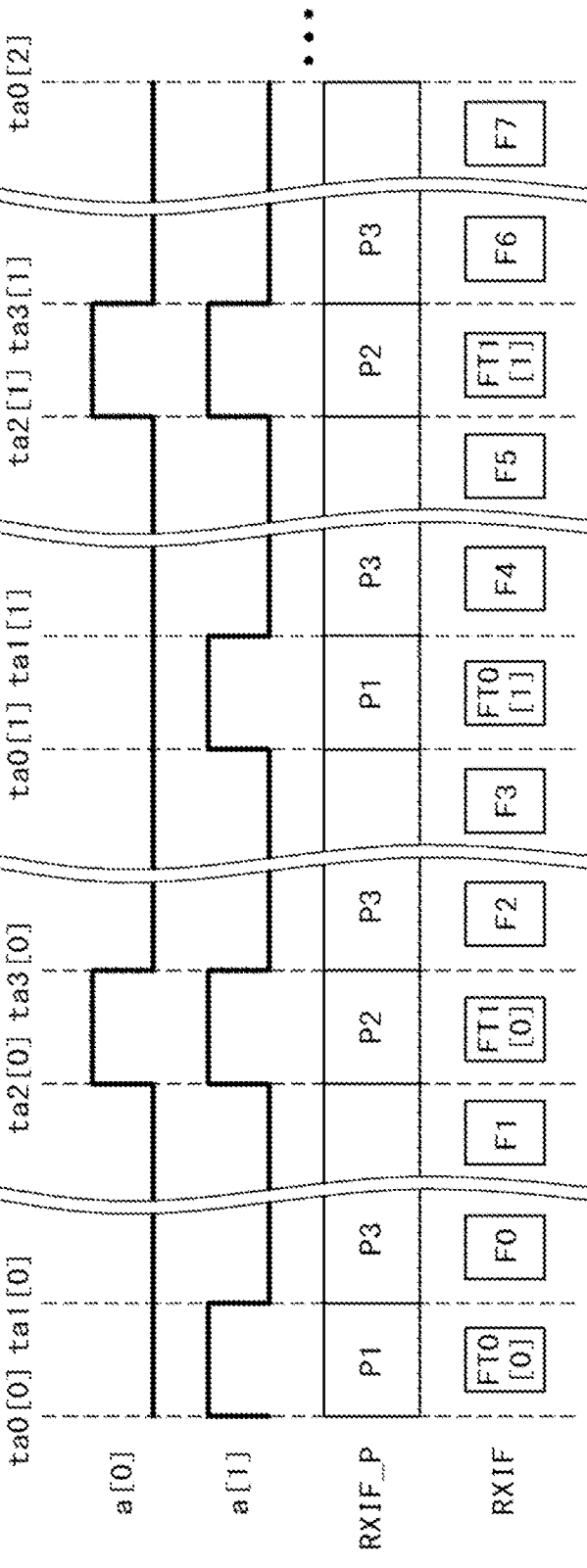

FIG. 4 is a timing chart of a reception interface in the exemplary settings of FIG. 3

Figure 5:
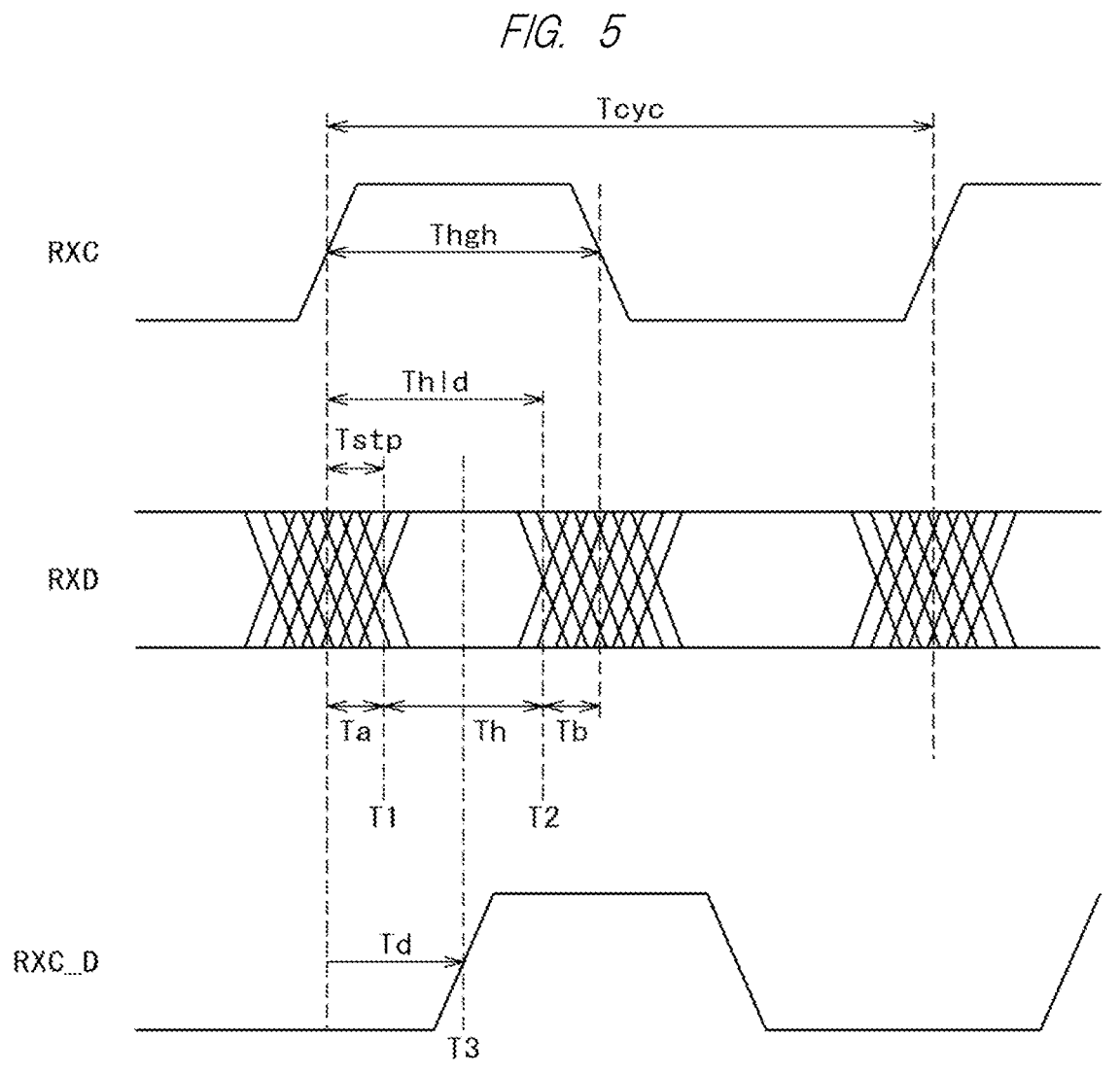

FIG. 5 is a timing chart for explaining a method for setting the number of taps of a reception clock delay circuit performed in a first period, a second period, and a third period in FIG. 4

Figure 6:
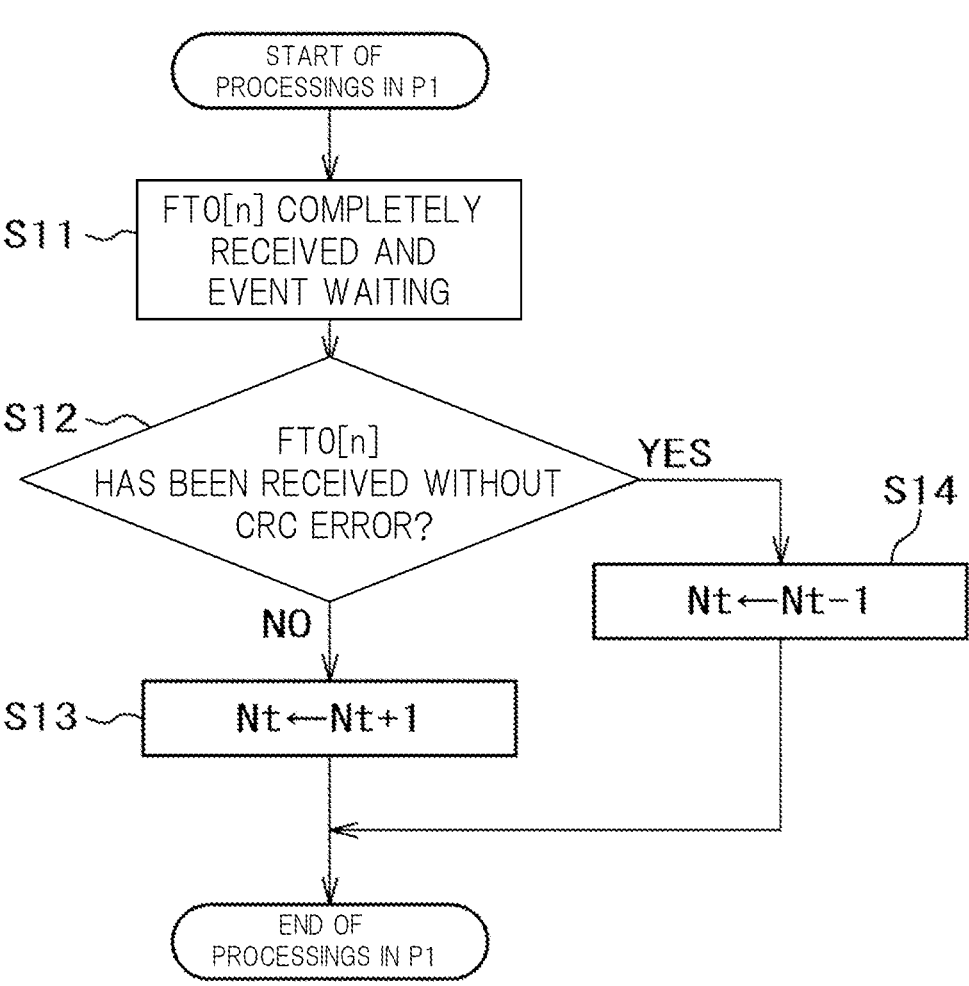

FIG. 6 is a flowchart of processing in the first period.

FIG. 7 is a flowchart of processing in the second period.

Figure 8:
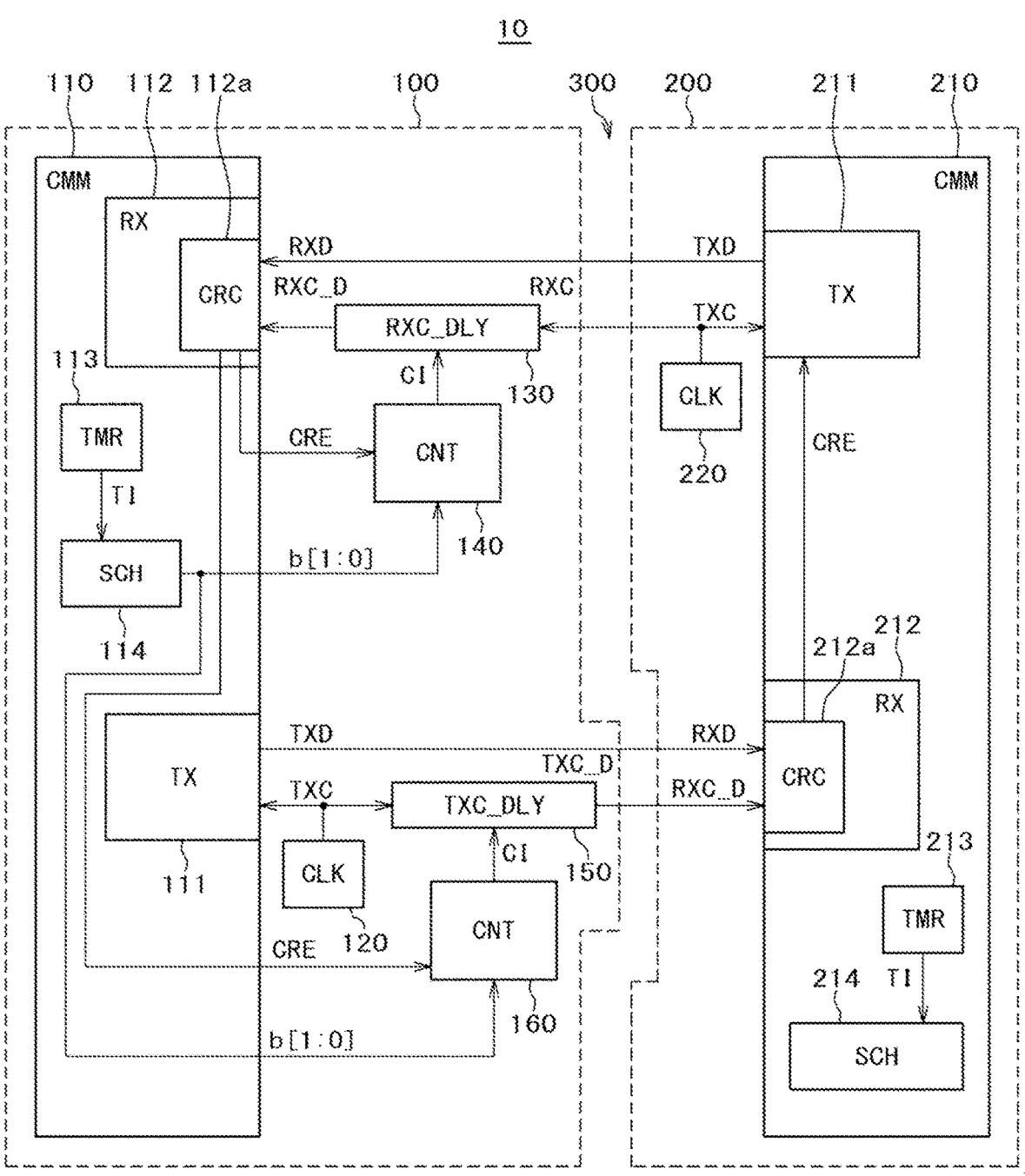

FIG. 8 is a block diagram of a configuration of semiconductor devices and a system using the same according to a first modification example.

Figures 9, 10:
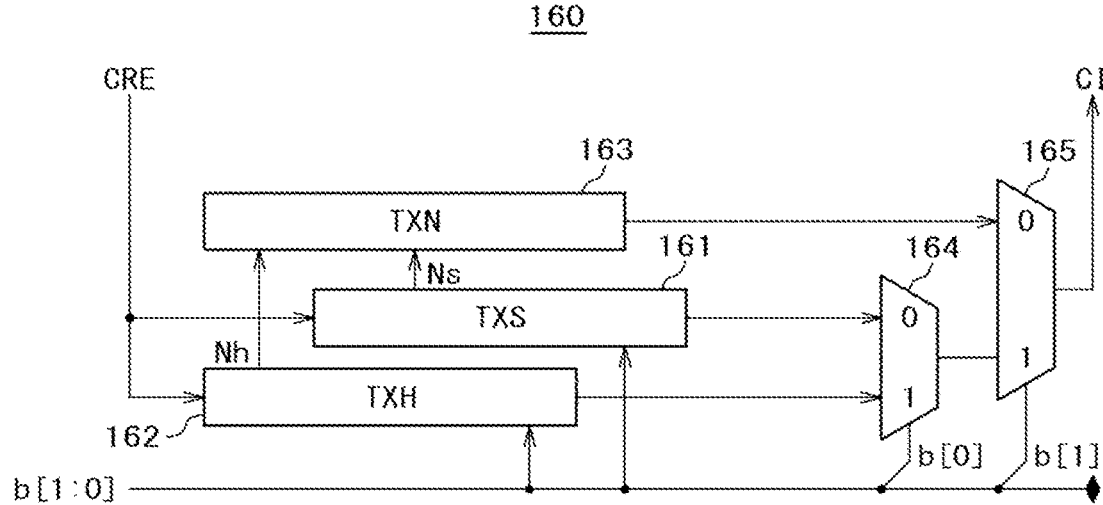

FIG. 9 is a block diagram of a configuration of a control circuit of a transmission clock delay circuit of FIG. 8.

FIG. 10 is a diagram of exemplary settings of time of a timer, a control signal, a reception interface period, and a transmission interface period in a first semiconductor device of FIG. 8.

FIG. 11 is a diagram of exemplary settings of time of a timer, a control signal, a reception interface period, and a transmission interface period in a second semiconductor device of FIG. 8.

Figure 12:
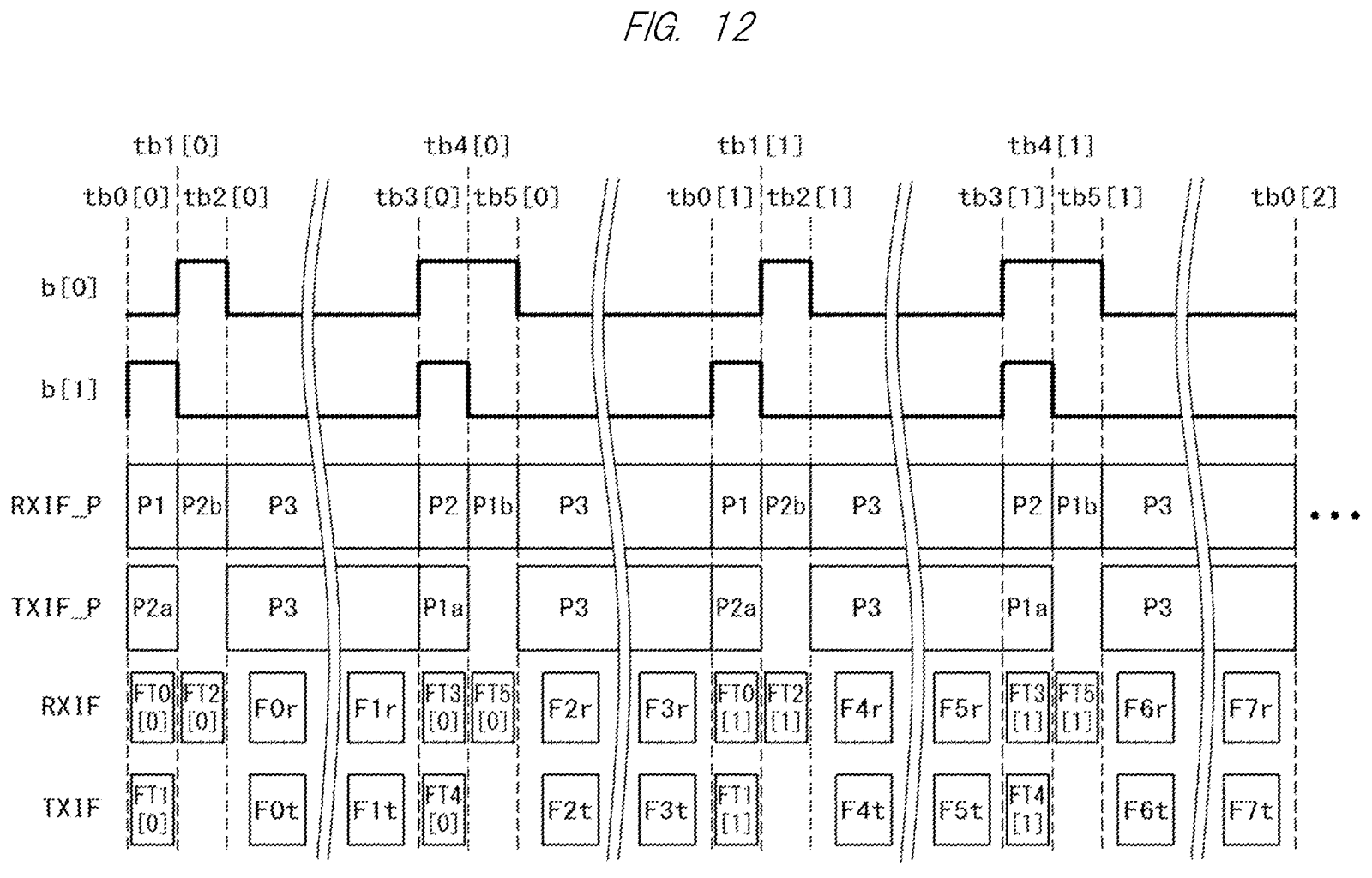

FIG. 12 is a timing chart of the reception interface and the transmission interface of the first semiconductor device in the exemplary settings of FIG. 10.

Figure 13:
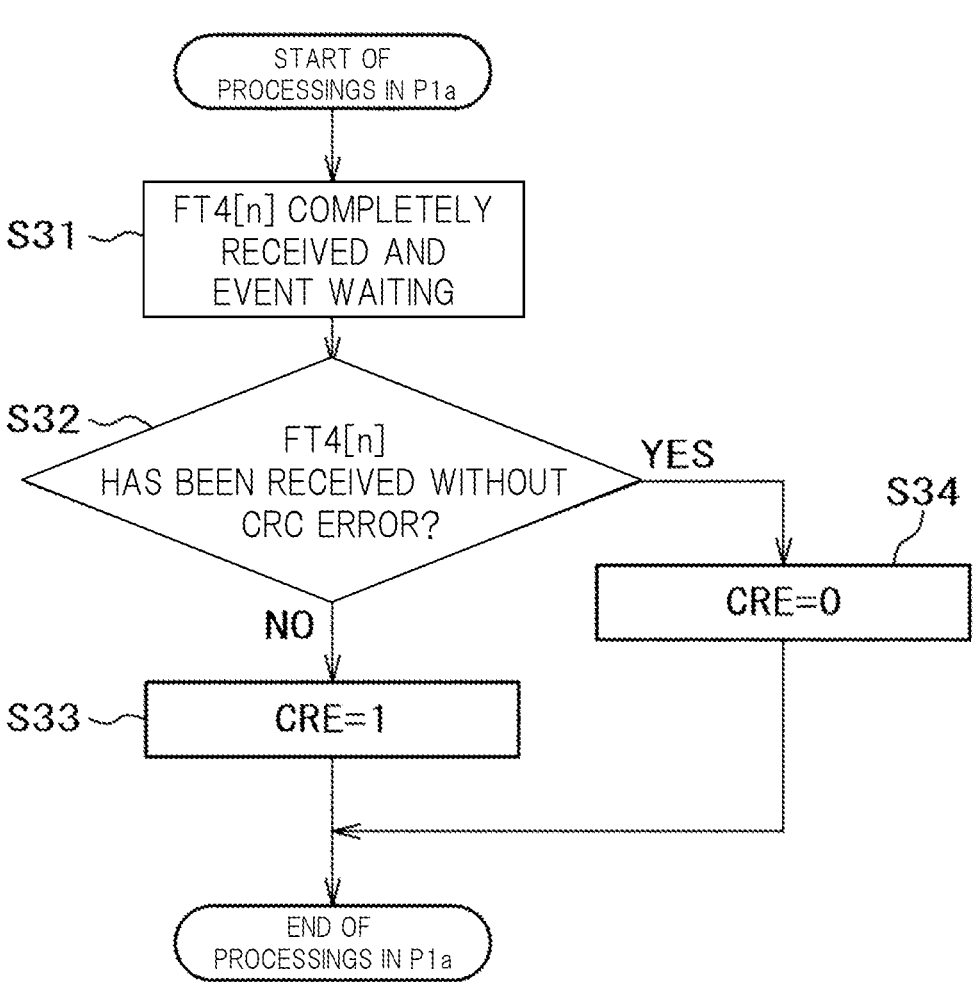

FIG. 13 is a flowchart of processing in a first period.

Figure 14:
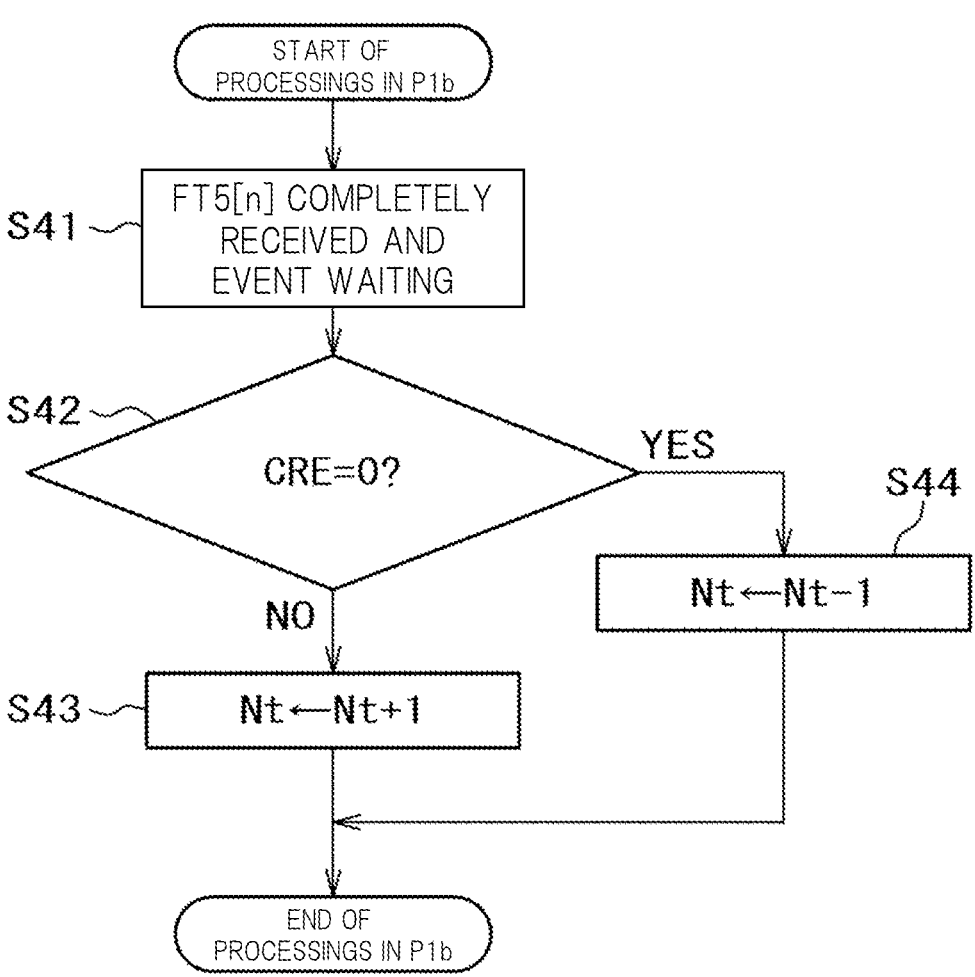

FIG. 14 is a flowchart of processing in a first transfer period.

Figure 15:
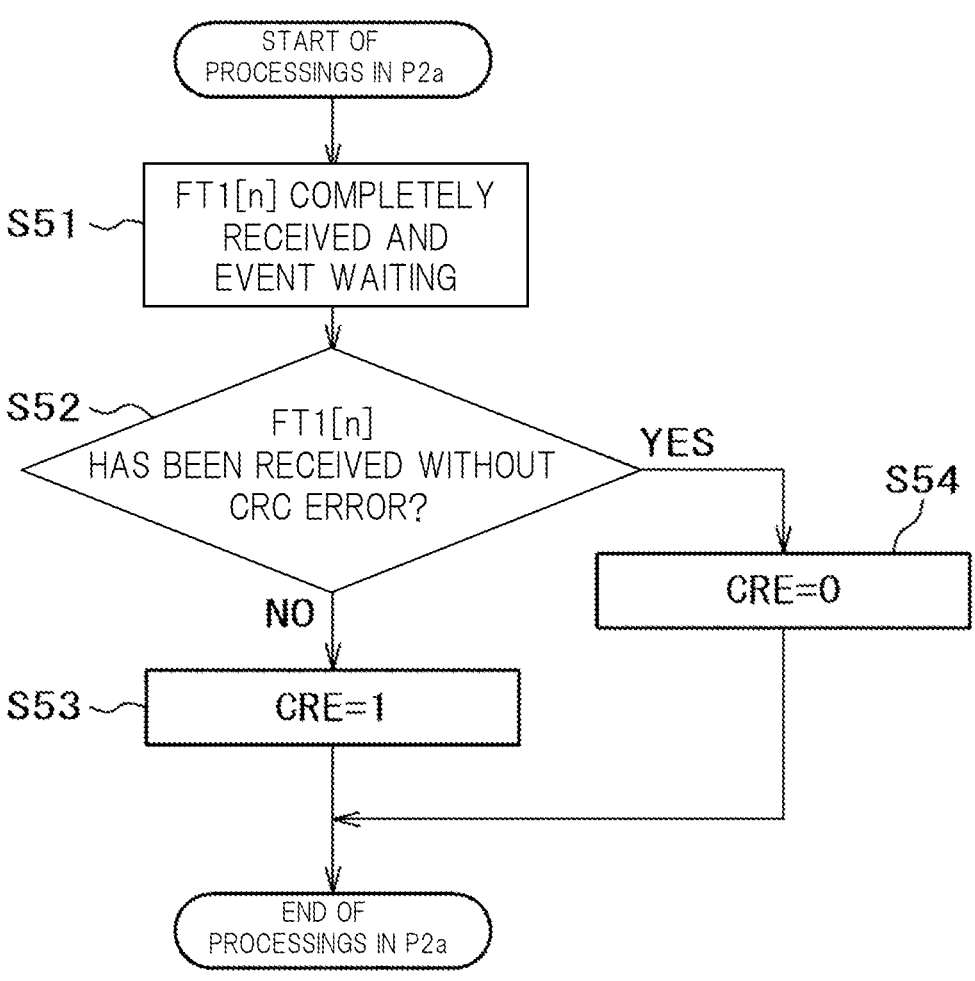

FIG. 15 is a flowchart of processing in a second period.

FIG. 16 is a flowchart of processing in a second transfer period.

Figure 17:
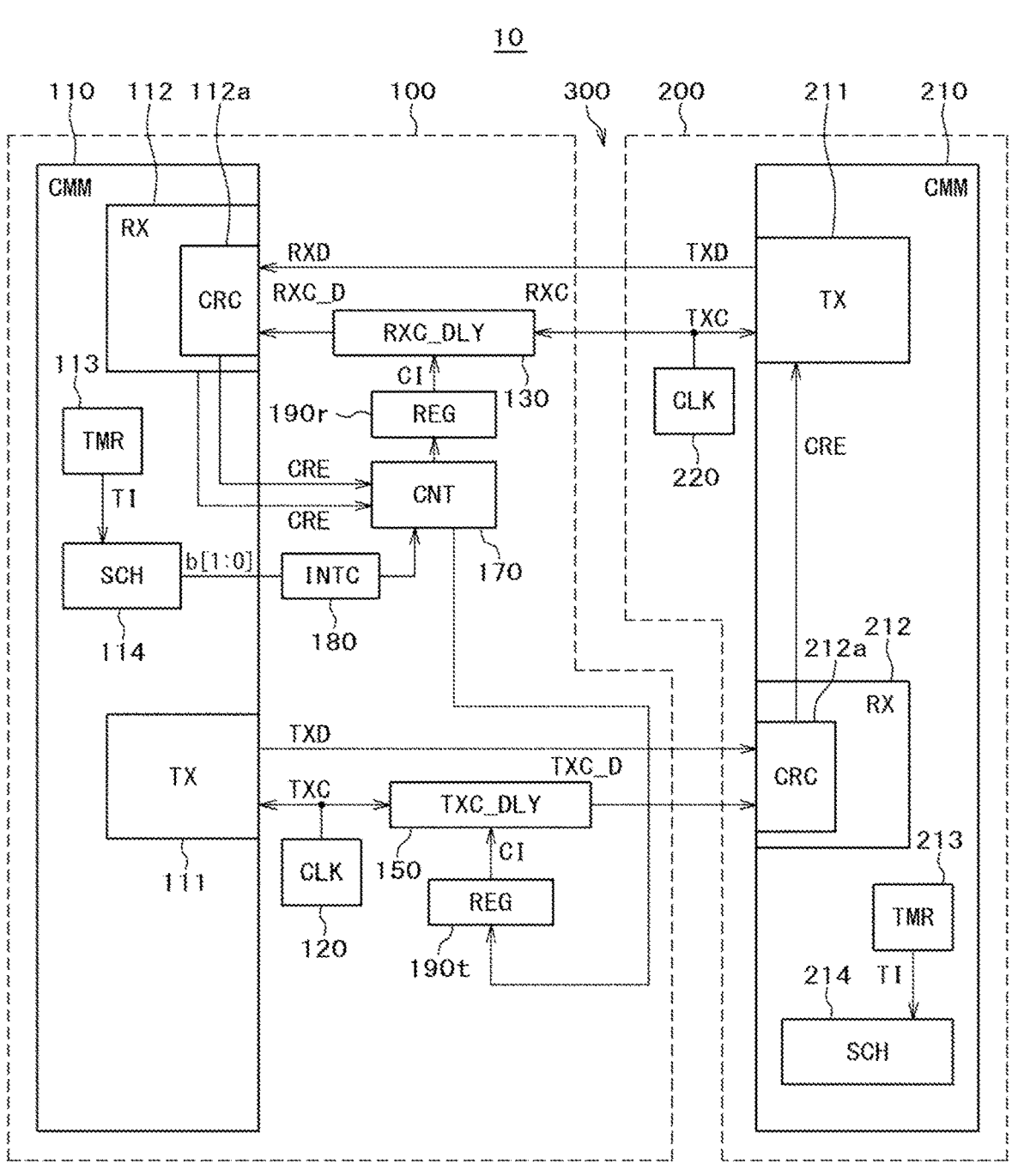

FIG. 17 is a block diagram of a configuration of semiconductor devices and a system using the same according to a second modification example.

DETAILED DESCRIPTION

Embodiments will be described below with reference to the drawings. The following description and drawings are omitted or simplified as needed for clear explanation. The same components are denoted with the same symbols, and the repetitive description thereof may be omitted.

Figure 1:
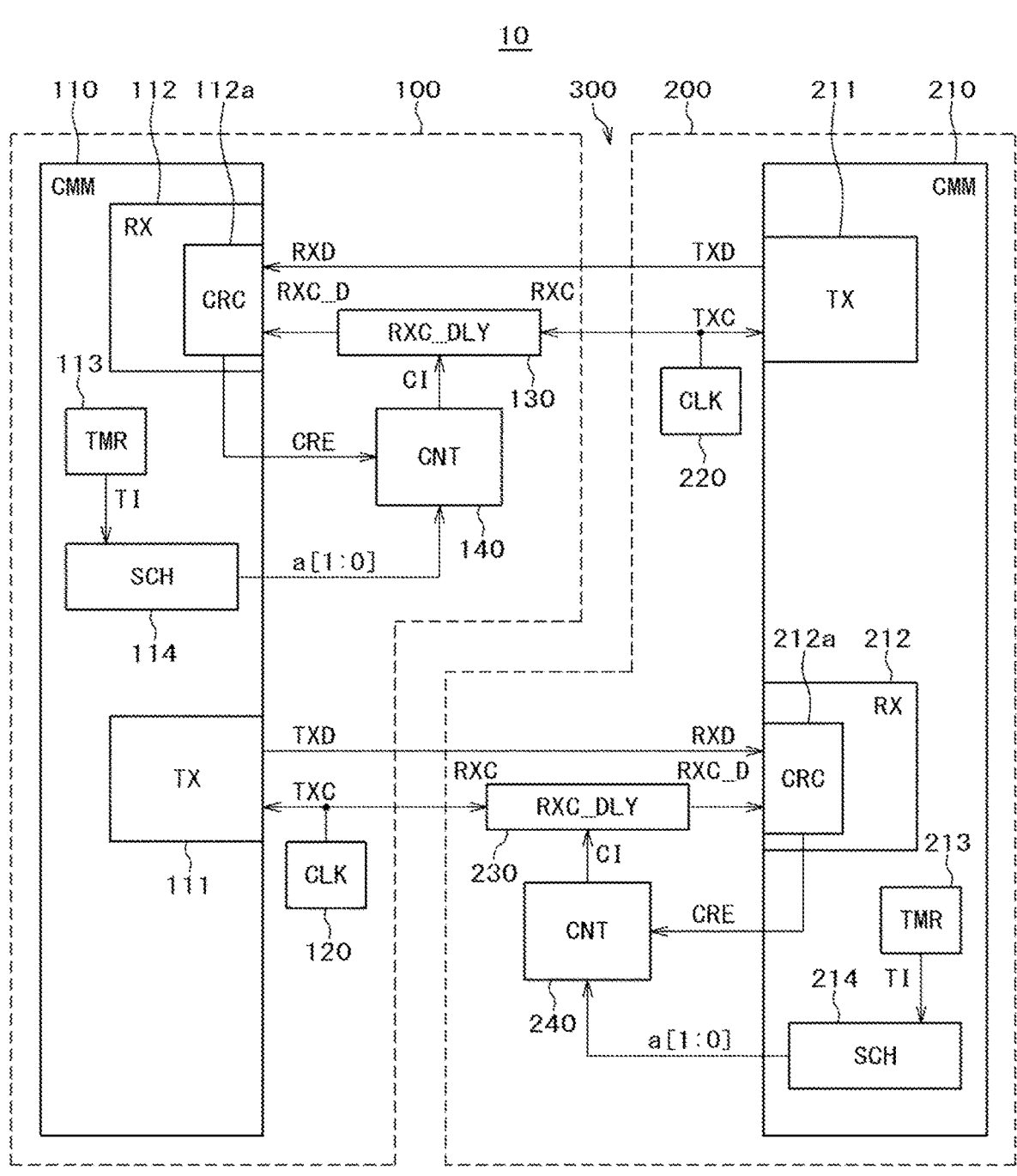
FIG. 1 is a block diagram of a configuration of semiconductor devices and a system using the same according to an embodiment.

FIG. 1 is a block diagram of a configuration of semiconductor devices and a system using the same according to an embodiment. FIG. 2 is a block diagram of a configuration of a control circuit of FIG. 1.

A wired local area network (LAN) system 10 includes a plurality of semiconductor devices 100, 200 and a Printed Circuit Board (PCB) 300 including network lines connecting between the semiconductor devices 100 and 200. In these drawings, a case in which the network system includes two semiconductor devices 100 and 200 will be exemplified in order to avoid complicated illustration. The number of semiconductor devices in the network system 10 is not limited to this case.

According to the embodiment, the first semiconductor device 100 and the second semiconductor device 200 have a similar configuration. Thus, as explanation for an entire configuration of the semiconductor devices 100 and 200, the semiconductor device 100 will be typified for the explanation. The symbols "2xx" of the components of the semiconductor device 200 correspond to the symbols "1xx" of the components of the semiconductor device 100, respectively.

The semiconductor device 100 includes a communication device (CMM) 110, a clock supply circuit (CLK) 120, a reception clock delay circuit (RXC_DLY) 130, and a control circuit (CNT) 140. The semiconductor device 100 may be, for example, a Micro Controller Unit (MCU) further including a central processing unit (CPU), a memory such as flash memory or SRAM, a direct memory access (DMA) controller, an analog-to-digital (A/D) converter, and the like. If a communication device 210 is conformity with the same standard as that of the communication device 110, the semiconductor device 200 may be different from the semiconductor device 100 in other components (such as CPU and memory) except for the reception clock delay circuit (RXC_DLY) 130 and the control circuit (CNT) 140.

The communication device 110 is a communication device supporting, for example, TSN (in conformity with the TSN standard), and has a TDMA function and a CRC function. The TSN (Time-Sensitive Network) is a series of standards which enable messaging with punctuality on standard wired LAN, and is defined by Institute of Electrical and Electronics Engineers (IEEE).

Time Division Multiple Access (TDMA) is a multiplexing system in which frequencies used for communication are divided and shared for every certain time. In the TDMA, by dividing a carrier frequency used for transmission in a unit that is called time slot, a plurality of communications are achieved at the same frequency. The data transmission is performed in a very short period by the sharing of the same frequency, and thus a plurality of pieces of data are apparently simultaneously transmitted.

Cyclic Redundancy Check (CRC) is a type of error detection code. In the CRC, a transmission side performs the transmission while adding a remainder of division in a defined generator polynomial as check data, a reception side divides data by using the same generator polynomial, and error and corruption of reception data are detected by comparing and checking a remainder of the division. The CRC defined in IEEE802.3 is CRC-32 whose value for check is 32 bits.

The communication device 110 includes a transmitter (TX) 111, a receiver (RX) 112, a timer (TMR) 113, and a scheduler (SCH) 114. The receiver (RX) 112 includes a CRC check circuit (CRC) 112a having a CRC function. The scheduler (SCH) 114 has a TDMA function.

The transmitter 111 transmits a plurality of pieces of transmission data {TXD} in parallel to a receiver 212 in the communication device 210 in the semiconductor device 200. The transmission data {TXD} contains a transmission control signal {TX CTL} and 4-bit transmission data {TXD[3:0]}. The pieces of transmission data {TX CTL, TXD[3:0]} each have a 1-bit width, and thus, are transmitted in series. The transmitter 111 includes a plurality of registers configured to store and output the transmission data {TX_CTL, TXD[3:0]} in synchronization with rise or fall of a transmission clock {TXC}.

The receiver 112 receives a plurality of pieces of reception data {RXD} from a transmitter 211 in the communication device 210 in the semiconductor device 200 in parallel. The reception data {RXD} contains a reception control signal {RX_CTL} and 4-bit reception data {RXD[3:0]}. The pieces of reception data {RX_CTL, RXD[3:0]} each have a 1-bit width and are received in series. The receiver 112 receives a delay reception clock {RXC_D} delayed by a delay adder circuit 130. The receiver 112 includes a plurality of registers configured to load the reception data {RX_CTL, RXD[3:0]} in synchronization with rise or fall of the delay reception clock {RXC_D}.

The timer 113 is a circuit configured to control the time to be the same between the semiconductor devices 100 and 200. Time of the timer 113 in the communication device 110 in the semiconductor device 100 is synchronized with time of a timer 213 in the communication device 210 in the semiconductor device 200 via the network. Time information {TI} synchronized between the semiconductor devices 100 and 200 is supplied from the timer 113 to the scheduler 114, and the schedulers 114 in the semiconductor devices 100 and 200 are the same as each other in time.

The scheduler 114 generates a 2-bit control signal {a[1:0]} for setting an operation of the control circuit 140. The scheduler 114 may change the control signal {a[1:0]} to an optional value at optional time on the basis of the time information {TI} of the 113 synchronized with a timer communication party.

The clock supply circuit (CLK) 120 multiplies or divides a clock source generated in the semiconductor device 100, and supplies the multiplied or divided clock source as a transmission clock {TXC} to the transmitter 111 and the semiconductor device 200. The clock source may not be multiplied or divided as the transmission clock {TXC}.

The delay adder circuit 130 receives the transmission clock {TXC} as a reception clock {RXC} from the clock supply circuit 220 in the semiconductor device 200. The delay adder circuit 130 delays the reception clock {RXC} and generates a delay reception clock {RXC_D} on the basis of delay-tap (TAP) number information {CI} set by the control circuit 140. The delay adder circuit 130 includes, for example, a delay section configured by sequentially connecting a plurality of delay elements, and a selector configured to select and output an output of any one of the delay elements as the delay reception clock {RXC_D}. How to select a delay element, from which the output is to be performed, selected by the selector, is controlled by the delay-tap number information {CI}. The delay adder circuit 130 may have other configuration.

As illustrated in FIG. 2, the control circuit 140 includes a control block (RXS) 141, a control block (RXH) 142, a control block (RXN) 143, a selector 144, and a selector 145.

The control block 141 confirms a setup margin of the reception data {RXD} for the reception clock {RXC} on the basis of a CRC error signal {CRE} indicating a check result (presence of the CRC error) in the CRC check circuit 112a. The control block 141 then outputs the delay-tap number information {CI}. Detailed operations of the control block 141 will be described later.

The control block 142 confirms a hold margin of the reception data {RXD} for the reception clock {RXC} on the basis of the CRC error signal {CRE}, and outputs the delay-tap number information {CI}. Detailed operations of the control block 142 will be described later.

The control block 143 calculates the delay-tap number information {CI} of the normal frame on the basis of the number of delay taps {Ns} found by the control block 141 and the number of delay taps {Nh} found by the control block 142. Detailed operations of the control block 143 will be described later.

The selector 144 performs switching between the outputs of the control block 141 and the control block 142. The selector 145 performs switching between the outputs of the control block 141 or 142 and the control block 143. For example, when the control signal {a[1:0]} is "10b", the output of the control block 141 is selected. When the control signal {a[1:0]} is "11b", the output of the control block 142 is selected. When the control signal {a[1:0]} is "00b", the output of the control block 143 is selected. Here, a term "b" indicates that its precedent number is binary.

In the semiconductor device 100 according to the present embodiment, timing margins of setup and hold between the reception data and the reception clock are measured in real time in a time division manner during activation and operation of the TDMA function of the scheduler 114. The semiconductor device 100 controls the number of delay taps of the delay adder circuit 130 of the reception clock in real time on the basis of the measurement results to follow the timing specification. The semiconductor device 100 determines an error by use of the CRC check circuit 112a, and directly measures a timing border at which the correct data is extracted.

A delay control method of the reception clock {RXC} will be described with reference to FIGS. 3 to 5. FIG. 3 is a diagram of exemplary settings of time of the timer, the control signal, and a reception interface period. FIG. 4 is a timing chart of the reception interface in the exemplary settings of FIG. 3. FIG. 5 is a timing chart for explaining a method for setting the number of delay taps in the delay adder circuit of the reception clock performed in a first period, a second period, and a third period in FIG. 4.

A reception interface period {RXIF_P} is divided into a first period {P1} to confirm the setup margin of the reception data {RXD}, a second period {P2} to confirm the hold margin of the reception data {RXD}, and a third period {P3} to receive the normal frame of the reception data {RXD}. For example, as illustrated in FIG. 3, the reception interface period {RXIF_P} in a period between start time {S_time} and end time {E_time} of the timer 113 is set as the first period {P1}, the second period {P2}, or the third period {P3} depending on the control signal {a[1:0]}.

When the control signal {a[1:0]} is "10b", the control block 141 is selected so that the first period {P1} is set. When the control signal {a[1:0]} is "11b", the control block 142 is selected so that the second period {P2} is set. When the control signal {a[1:0]} is "00b", the control block 143 is selected so that the third period {P3} is set.

In other words, in the example of FIG. 3, the start time of the first period {P1} is ta0[n] while the end time thereof is ta1[n]. The start time of the second period {P2} is ta2[n] while the end time thereof is ta3[n]. The third period {P3} has two periods, and the start time of the first period is ta1[n] while the end time thereof is ta2[n]. The start time of the second period is ta3[n] while the end time thereof is ta0[n+1]. Here, "n" is an integer of zero or more, and [n] indicates an n-th cycle. The contents of FIG. 3 may be set in, for example, a register in the scheduler 114 by the CPU.

Because of the settings of FIG. 3, a reception interface {RXIF} receives the frames illustrated in FIG. 4. FIG. 4 illustrates a case of "n=0 to 1". Since the semiconductor device 200 transmits frames to be received by the semiconductor device 100, the setting information illustrated in FIG. 3 (except for the control signal {a[1:0]}) is set in the scheduler 214. However, the reception interface period {RXIF_P} becomes a transmission interface period {TXIF_P}.

(ta0[0] to ta1[0]): First Period {P1}

A transmission interface {TXIF} of the semiconductor device 200 transmits a frame (check frame, first frame) {FT0[0]} to be used for confirming the setup margin of the reception data {RXD} by the semiconductor device 100. Then, a reception interface {RXIF} of the semiconductor device 100 receives the frame {FT0[ 0]}.

(ta1[0] to ta2[0]): Third Period {P3}

The transmission interface {TXIF} of the semiconductor device 200 transmits normal frames {F0, F1} of the data {RXD} to be received by the semiconductor device 100. Then, the reception interface {RXIF} of the semiconductor device 100 receives the normal frames {F0, F1}.

(ta2[0] to ta3[0]): Second Period {P2}

The transmission interface {TXIF} of the semiconductor device 200 transmits a frame (check frame, second frame) {FT1[0]} to be used for confirming the hold margin of the reception data {RXD} by the semiconductor device 100. Then, the reception interface {RXIF} of the semiconductor device 100 receives the frame {FT1[0]}.

{ta3[0] to ta0[1]}: Third Period {P3}

The transmission interface {TXIF} of the semiconductor device 200 transmits normal frames {F2, F3} of the data {RXD} to be received by the semiconductor device 100. Then, the reception interface {RXIF} of the semiconductor device 100 receives the normal frames {F2, F3}.

(ta0[1] to ta1[1]): First Period {P1}

The transmission interface {TXIF} of the semiconductor device 200 transmits a frame {FT0[1]} to be used for confirming the setup margin of the reception data {RXD} by the semiconductor device 100. Then, the reception interface {RXIF} of the semiconductor device 100 receives the frame {FT0[1]}.

(ta1[1] to ta2[1]): Third period {P3}

The transmission interface {TXIF} of the semiconductor device 200 transmits normal frames {F4, F5} of the data {RXD} to be received by the semiconductor device 100. Then, the reception interface {RXIF} of the semiconductor device 100 receives the normal frames {F4, F5}.

(ta2[1] to ta3[1]): Second period {P2}

The transmission interface {TXIF} of the semiconductor device 200 transmits a frame {FT1[1]} to be used for confirming the hold margin of the reception data {RXD} by the semiconductor device 100. Then, the reception interface {RXIF} of the semiconductor device 100 receives the frame {FT1[1]}.

(ta3[1] to ta0[2]): Third Period {P3}

The transmission interface {TXIF} of the semiconductor device 200 transmits normal frames {F6, F7} of the data {RXD} to be received by the semiconductor device 100. Then, the reception interface {RXIF} receives the normal frames {F6, F7}.

A case in which the delay adder circuit 130 is configured to have, for example, 100 taps as the total number of delay taps will be discussed. If time as shown in the following [Exemplary settings] is scheduled, a ratio of the time (check period) occupied by the first period {P1} and the second period {P2} to the total time is about 0.3%. Note that time in the exemplary settings is time taken for check of one tap as the number of delay taps. Even if the time of the first period {P1} and the second period {P2} is secured at the ratio of about 0.3% as described above, the case of the check of 100 taps as the total number of delay taps takes "2006 µS×100≈0.2 s". During this time, the clock delay time of the delay adder circuit 130 can be changed from the minimum to the maximum or from the maximum to the minimum, and thus this time is sufficient for general use.

[Exemplary Settings]

Time of first period$\{P1\}=ta1[n]-ta0[n]=3$ µs

Time of second period$\{P2\}=ta3[n]-ta2[n]=3$ µs

Time of third period$\{P3\}=ta2[n]-ta1[n]$ $=ta0[n+1]-ta3[n]$ $=1$ ms$=1000$ µs

The ratio of the check period is expressed in (time of P1+time of P2)/{time of P1+time of P2+(time of P3)×2}, and is "6 µS/2000 µS"≈0.003 =0.3% in the exemplary settings.

A case in which a transfer speed of setup time and hold time for the reception clock {RXC} of the reception data {RXD} is 1 Gbps (125 MHz) will be exemplified and described with reference to FIG. 5.

One cycle of the reception clock {RXC} is expressed as Tcyc, a high period is expressed as Thgh, and a duty ratio is expressed as Duty. Exemplary standards of the reception clock {RXC} are as follows.

Tcyc=8.0 ns (125 MHz)±10%
Thgh=3.24 ns (minimum)
=4.0 ns (standard)
=4.76 ns (maximum)
Duty=50%±5%

The minimum setup time to secure and hold the reception data {RXD} before rise of the reception clock {RXC} is expressed as Tstp. The minimum hold time to hold the reception data {RXD} after the rise of the reception clock {RXC} is expressed as Thld. The exemplary standards of the reception data {RXD} are as follows.

Tstp=−0.9 ns
Thld=2.7 ns

The reception data {RXD} is loaded into the register by the delay reception clock {RXC_D}. The margins of both the setup time and the hold time can be increased by bringing the delay reception clock {RXC_D} to rise at middle time between the defined setup time and hold time. However, the defined setup time and hold time are at the minimum values, and actual setup time and hold time are longer than the defined time. Thus, a difference between the actual setup time and the defined setup time and a difference between the actual hold time and the defined hold time may be different. Therefore, when the delay reception clock {RXC_D} rises at the middle time between the defined setup time and the defined hold time, the margin of either the setup time or the hold time may decrease.

Thus, the margins of the setup time and the hold time of the reception data {RXD} are confirmed, and the delay time {Td} from the rise of the reception clock {RXC} to the rise of the delay reception clock {RXC_D} is determined. Timings {T1, T2} at which the reception data {RXD} can be correctly loaded are confirmed by changing the delay time (the number of delay taps) of the delay reception clock {RXC_D}.

For example, the delay time of the delay reception clock {RXC_D} at timing {T1} in the setup time is expressed as Ta. Time before fall of the reception clock {RXC} during the delay time of the delay reception clock {RXC_D} at timing {T1} in the hold time is expressed as Tb. Time between timing {T1} and timing {T2} is expressed as Th. The exemplary time is as follows.

Ta=0.9 ns
Tb=0.9 ns
Th=1.8 ns(minimum)
=2.2 ns (standard)
=2.6 ns (maximum)
Td=1.62 ns (minimum)
=2.0 ns (standard)
=2.38 ns (maximum)

A method of setting the number of delay taps based on the setup margin confirmation performed in the first period {P1} will be described with reference to FIG. 6. FIG. 6 is a flowchart of processing in the first period.

The communication device 110 in the semiconductor device 100 finishes receiving the frame {FT0[n]}, and waits for an event (step S11).

It is confirmed whether the frame {FT0[n]} can be received without a CRC error (step S12). That is, in the receiver 112, the reception data {RXD} is loaded into the register by the delay reception clock {RXC_D}. The CRC check circuit 112*a* checks whether the data loaded into the register contains the error (CRC error), and outputs a CRC error signal {CRE} indicating the result.

The control block 141 changes the number of delay taps (Nt) on the basis of the CRC error signal {CRE}. When the CRC error occurs (for example, at CRE=1), the control block 141 increments the number of delay taps (Nt) by one (Nt←Nt+1) to increase the delay of the clock line (step S13).

When the CRC error does not occur (for example, at CRE=0), the control block 141 decrements the number of delay taps by one (Nt←Nt−1) to decrease the delay of the clock line (step S14).

Thus, the control block 141 determines the number of delay taps not causing the CRC error, which is larger by one than the number of delay taps causing the CRC error. The number of delay taps is expressed as Ns.

A method of setting the number of delay taps based on the hold margin confirmation performed in the second period {P2} will be described with reference to FIG. 7. FIG. 7 is a flowchart of processing in the second period.

The communication device 110 in the semiconductor device 100 finishes receiving the frame {FT1[n]}, and waits for an event (step S21).

It is confirmed whether the frame {FT1[n]} can be received without the CRC error (step S22). That is, in the receiver 112, the reception data {RXD} is loaded into the register by the delay reception clock {RXC_D}. The CRC check circuit 112*a* checks whether the data loaded into the register contains the error (CRC error), and outputs the CRC error signal {CRE} indicating the result.

The control block 142 changes the number of delay taps (Nt) on the basis of the CRC error signal {CRE}. When the CRC error occurs (for example, at CRE=1), the control block 142 decrements the number of delay taps (Nt) by one (Nt←Nt−1) to decrease the delay of the clock line (step S23).

When the CRC error does not occur (for example, at CRE=0), the control block 142 increments the number of delay taps by one (Nt←Nt+1) to increase the delay of the clock line (step S24).

Thus, the control block 142 determines the number of delay taps not causing the CRC error, which is smaller by one than the number of delay taps causing the CRC error. The number of delay taps is expressed as Nh.

A method of setting the number of delay taps in the third period {P3} will be described.

The control block 143 calculates an arithmetic average between the number of delay taps {Ns} found in the first period {P1} and the number of delay taps {Nh} found in the second period {P2}, and assumes the calculated arithmetic average as the number of delay taps {Nn} in the third period {P3} (Nn=(Ns+Nh)/2). The normal frame is then received. That is, in the receiver 112, the reception data {RXD} is loaded into the register by the delay reception clock {RXC_D} delayed by the delay adder circuit 130 in which the number of delay taps is set as Nn.

In the technique described in the Patent Document 1, the target period thresholds (time thresholds TS1 and TS2 in FIG. 6 of the Patent Document 1) and the voltage thresholds (voltage thresholds VS1 and VS2 in FIG. 7 of the Patent Document 1) to be borders to change the amount of delay in the clock generation section are not borders at which the data is correctly loaded.

On the other hand, in the embodiment, the timing border at which the data is correctly loaded is directly measured by use of the CRC check circuit, and thus measurement errors can be reduced. Therefore, a larger timing margin than that of the technique of the Patent Document 1 can be taken.

MODIFICATION EXAMPLES

Some representative modification examples of the embodiment will be exemplified below. In the following description of the modification examples, components having the similar structures and functions to those described in the above embodiment may be denoted with the similar symbols to those in the above embodiment. The description in the above embodiment is applicable to the description of the components within the technically inconsistent scope. Part of the above embodiment and all or part of the modification examples is comprehensively applicable as needed within the technically inconsistent scope.

First Modification Example

FIG. 8 is a block diagram of a configuration of semiconductor devices and a system using the same according to a first modification example. FIG. 9 is a block diagram of a configuration of a control circuit of a transmission clock delay circuit of FIG. 8.

In the embodiment, the semiconductor devices 100 and 200 include the delay adder circuits 130 and 230 for the reception clock {RXC} and the control circuits 140 and 240 thereof, respectively. On the other hand, in the present modification example, as illustrated in FIG. 8, the semiconductor device 100 includes the delay adder circuit 130 for the reception clock {RXC} and the control circuit 140 thereof and a delay adder circuit 150 for the transmission clock {TXC} and a control circuit 160 thereof. The semiconductor device 200 does not include the delay adder circuit 230 for the reception clock {RXC} and the control circuit 240 thereof.

The delay adder circuit 150 receives the transmission clock {TXC} from the clock supply circuit 120 in the semiconductor device 100, delays the transmission clock {TXC} on the basis of the delay-tap number information {CI} set by the control circuit 160, and generates the delay transmission clock {TXC_D}. The delay adder circuit 150 has a similar configuration to the delay adder circuit 130.

As illustrated in FIG. 9, the control circuit 160 includes a control block (TXS) 161, a control block (TXH) 162, a control block (TXN) 163, a selector 164, and a selector 165.

The control block 161 confirms the setup margin of the transmission data {TXD} for the transmission clock {TXC} on the basis of the signal {CRE}, and outputs the delay-tap number information {CI}. The CRC error signal {CRE} is supplied from a CRC check circuit 212a in the receiver 212 in the semiconductor device 200 to the control circuit 160 via the transmitter 211 and the receiver 112 in the semiconductor device 100. The control block 161 performs the same operation as that of the control block 141 in the embodiment.

The control block 162 confirms the hold margin of the transmission data {TXD} for the transmission clock {TXC} on the basis of the CRC error signal {CRE}, and outputs the delay-tap number information {CI}. The control block 162 performs the same operation as that of the control block 142 in the embodiment.

The control block 163 calculates the delay-tap number information {CI} of the normal frame on the basis of the number of delay taps {Ns} found by the control block 161 and the number of delay taps {Nh} found by the control block 162. The control block 163 performs the same operation as that of the control block 143 in the embodiment.

The selector 164 performs switching between the outputs of the control block 161 and the control block 162. The selector 165 performs switching between the outputs of the control block 161 or 162 and the control block 163. For example, when a control signal {b[1:0]} is "10b", the control block 161 is selected. When the control signal {b[1:0]} is "11b", the control block 162 is selected. When the control signal {b[1: 0]} is "00b", the control block 163 is selected.

A method of controlling delays of the reception clock {RXC} and the transmission clock {TXC} of the semiconductor device 100 will be described with reference to FIGS. 10 to 12. FIG. 10 is a diagram of exemplary settings of time of the timer, the control signal, the reception interface period, and the transmission interface period in the first semiconductor device of FIG. 8. FIG. 11 is a diagram of exemplary settings of time of the timer, the control signal, the reception interface period, and the transmission interface period in the second semiconductor device of FIG. 8. FIG. 12 is a timing chart of the reception interface and the transmission interface of the first semiconductor device in the exemplary settings of FIG. 10.

The reception interface period {RXIF P} of the semiconductor device 100 is divided into the first period {P1}, the second period {P2}, the third period {P3}, a first transfer period {P1b}, and a second transfer period {P2b}. The first period {P1} is to confirm the setup margin of the reception data {RXD}. The second period {P2} is to confirm the hold margin of the reception data {RXD}. The third period {P3} is to receive the normal frame of the reception data {RXD}. The first transfer period {P1b} is to transfer the CRC check result for confirming the setup margin of the transmission data. The second transfer period {P2b} is to transfer the CRC check result for confirming the hold margin of the transmission data.

For example, as illustrated in FIG. 10, the reception interface period {RXIF_P} between the start time (S_time) and the end time (E_time) of the timer 113 is set as the first period {P1}, the second transfer period {P2b}, the third period {P3}, the second period {P2}, the first transfer period {P1b}, or the third period {P3}.

When the control signal {b[1:0]} is "10b", the control block 141 is selected so that the first period {P1} is set. When the control signal {b[1:0]} is "11b", the control block 142 is selected so that the second period {P2} is set. When the control signal {b[1:0]} is "00b", the control block 143 is selected so that the third period {P3} is set.

When the control signal {b[1:0]} is "01b", the control block 143 is selected so that the first transfer period {P1b} or the second transfer period {P2b} is set. When the previous control signal {b[1:0]} is "10b", the second transfer period {P2b} is set. When the previous control signal {b[1:0]} is "11b", the first transfer period {P1b} is set.

That is, the start time of the first period {P1} is tb0[n] while the end time thereof is tb1[n]. The start time of the second period {P2} is tb3[n] performs switching between the end time thereof is tb4[n]. The third period {P3} has two periods, and the start time of the first period is tb2[n] while the end time thereof is tb3[n]. The start time of the second period is tb5[n] while the end time thereof is tb0[n+1]. The start time of the first transfer period {P1b} is tb4[n] while the end time thereof is tb5[n]. The start time of the second transfer period {P2b} is tb1[n] while the end time thereof is tb2[n]. Here, a term "n" is an integer of zero or more, and

[n] indicates an n-th cycle. The contents of FIG. 10 may be set in, for example, the register in the scheduler 114 by the CPU.

The transmission interface period {TXIF_P} of the semiconductor device 100 is divided into a first period {P1a} to confirm the setup margin of the transmission data, a second period {P2a} to confirm the hold margin of the transmission data, and the third period {P3} to transmit the normal frame of the transmission data.

For example, as illustrated in FIG. 10, the transmission interface period {TXIF_P} between the start time (S time) and the end time (E_time) of the timer 113 is set as the second period {P2a}, the third period {P3}, the first period {P1a}, or the third period {P3}.

When the control signal {b[1:0]} is "10b", the control block 162 is selected so that the second period {P2a} is set. When the control signal {b[1:0]} is "11b", the control block 161 is selected so that the first period {P1a} is set. When the control signal {b[1:0]} is "00b", the control block (TXN) 163 is selected so that the third period {P3} is set.

That is, the start time of the second period {P2a} is tb0[n] while the end time thereof is tb1[n]. The start time of the first period {P1a} is tb3[n] while the end time thereof is tb4[n]. The third period {P3} has two periods, and the start time of the first period is tb2[n] while the end time thereof is tb3[n]. The start time of the second period is tb5[n] while the end time thereof is tb0[n+1].

Because of the settings of FIG. 10, the reception interface {RXIF} and a transmission interface {TXIF} of the semiconductor device 100 receive and transmit the frame illustrated in FIG. 12. FIG. 12 illustrates a case of "n=0 to 1".

The setting information of FIG. 11 is set in the scheduler 214 in order for the semiconductor device 200 to transmit the frame to be received by the semiconductor device 100 and to receive the frame to be transmitted by the semiconductor device 100. In this case, the reception interface period {RXIF_P} of the semiconductor device 100 is the transmission interface period {TXIF_P} of the semiconductor device 200. The transmission interface period {TXIF_P} of the semiconductor device 100 is the reception interface period {RXIF_P} of the semiconductor device 200.

(tb0[0] to tb1[0])

The processing in the first period {P1} of the reception interface period {RXIF_P} and the processing in the second period {P2a} of the transmission interface period {TXIF_P} are performed in parallel, or either one of them is earlier performed.

[RXIF_P: First Period {P1}]

The transmission interface {TXIF} of the semiconductor device 200 transmits a frame {FT0[0]} by which the semiconductor device 100 confirms the setup margin of the reception data {RXD}. The reception interface {RXIF} of the semiconductor device 100 receives the frame {FT0[0]}.

[TXIF_P: Second Period {P2a}]

The transmission interface {TXIF} of the semiconductor device 100 transmits a frame {FT1[0]} by which the hold margin of the transmission data {TXD} is confirmed. A reception interface {RXIF} of the semiconductor device 200 receives the frame {FT1[0]}. The semiconductor device 200 confirms whether the frame {FT1[0]} can be received without the CRC error. That is, in the receiver 212, the reception data {RXD} is loaded into the register by the delay reception clock {RXC_D}. The CRC check circuit 212a checks whether the data loaded into the register contains the error (CRC error). For example, when it contains the CRC error, "CRE=1" is set, and when it does not contain the CRC error, "CRE=0" is set.

(tb1[0] to tb2[0])

[RXIF_P: Second Transfer Period {P2b}]

The transmission interface {TXIF} of the semiconductor device 200 transmits a frame {FT2[0]} to transfer the CRC check result for confirming the hold margin of the transmission data {TXD}. The reception interface {RXIF} of the semiconductor device 100 receives the frame {FT2[0]}. The semiconductor device 100 confirms the hold margin of the transmission data on the basis of the received CRC check result.

(tb2[0] to tb3[0])

The setting processing of the number of delay taps in the third period {P3} of the reception interface period {RXIF_P} and the setting processing of the number of delay taps in the third period {P3} of the transmission interface period {TXIF_P} are performed in parallel or either one of them is earlier performed.

[RXIF_P: Third Period {P3}]

The transmission interface {TXIF} of the semiconductor device 200 transmits normal frames {F0r, F1r} of the reception data {RXD} to be received by the semiconductor device 100. The reception interface {RXIF} of the semiconductor device 100 receives the normal frames {F0r, F1r}.

[TXIF_P: Third Period {P3}]

The transmission interface {TXIF} of the semiconductor device 100 transmits normal frames {F0t, F1t} of the transmission data {TXD}. The reception interface {RXIF} of the semiconductor device 200 receives the normal frames {F0t, F1t}.

(tb3[0] to tb4[0])

The processing in the second period {P2} of the reception interface period {RXIF_P} and the processing in the first period {P1a} of the transmission interface period {TXIF_P} are performed in parallel or either one of them is earlier performed.

[RXIF_P: Second Period {P2}]

The reception interface {RXIF} of the semiconductor device 100 receives a frame {FT3[0]} to confirm the hold margin of the reception data {RXD}.

[TXIF P: First Period {P1a}]

The transmission interface {TXIF} of the semiconductor device 100 transmits a frame {FT4[0]} to confirm the setup margin of the transmission data {TXD}. The reception interface {RXIF} of the semiconductor device 200 receives the frame {FT4[0]}. The semiconductor device 200 confirms whether the frame {FT4[0]} can be received without the CRC error. That is, in the receiver 212, the reception data {RXD} is loaded into the register by the delay reception clock {RXC_D}. The CRC check circuit 212a checks whether the data loaded into the register contains the error (CRC error). For example, when it contains the CRC error, "CRE=1" is set. When it does not contain the CRC error, "CRE=0" is set.

(tb4[0] to tb5[0])

[RXIF_P: First transfer period {P1b}]

The transmission interface {TXIF} of the semiconductor device 200 transmits a frame {FT5[0]} to transfer the CRC check result for confirming the hold margin of the transmission data. The reception interface {RXIF} of the semiconductor device 100 receives the frame {FT5[0]}. The semiconductor device 100 confirms the setup margin of the transmission data on the basis of the received CRC check result.

(tb5[0] to tb0[1]): Third Period {P3}

The setting processing of the number of delay taps in the third period {P3} of the reception interface period {RXIF_P} and the setting processing of the number of delay taps in the third period {P3} of the transmission interface period {TXIF_P} are performed in parallel or either one of them is earlier performed.

[RXIF_P: Third Period {P3}]

The transmission interface {TXIF} of the semiconductor device 200 transmits normal frames {F2r, F3r} of the reception data {RXD} to be received by the semiconductor device 100. The reception interface {RXIF} of the semiconductor device 100 receives the normal frames {F2r, F3r}.

[TXIF_P: Third Period {P3}]

The transmission interface {TXIF} of the semiconductor device 100 transmits normal frames {F2t, F3t} of the transmission data {TXD}. The reception interface {RXIF} of the semiconductor device 200 receives the normal frames {F2t, F3t}.

The operations in the periods {tb0[1] to tb1[1]}, {tb1[1] to tb2[1]}, {tb2[1] to th3[1]}, {tb3[1] to th4[1]}, {tb4[1] to tb5[1]}, and {tb5[1] to tb0[2]} are similar to the operations in the periods {tb0[0] to th1[0]}, {tb1[0] to th2[0]}, {tb2[0] to th3[0]}, {tb3[0] to th4[0]}, {tb4[0] to tb5[0]}, and {tb5[0] to tb0[1]}, respectively.

The method of setting the number of delay taps of the delay adder circuit 130 for the reception clock {RXC} is similar to that of the embodiment. A method of setting the number of delay taps of the delay adder circuit 150 for the transmission clock {TXC} will be described below.

A method of setting the number of delay taps by setup margin confirmation performed in the first period {P1a} and the first transfer period {P1b} will be described with reference to FIG. 13 and FIG. 14. FIG. 13 is a flowchart of processing in the first period. FIG. 14 is a flowchart of processing in the first transfer period.

First, the processing in the first period {P1a} will be described.

The transmission interface {TXIF} of the semiconductor device 100 transmits a frame {FT4[n]}.

The reception interface {RXIF} of the semiconductor device 200 finishes receiving the frame {FT4[n]}, and waits for an event (step S31).

It is confirmed whether the frame {FT4[n]} can be received without the CRC error. That is, in the receiver 212, the reception data {RXD} is loaded into the register by the delay reception clock [RXC_D]. The CRC check circuit 212a checks whether the data loaded into the register contains the error (CRC error) (step S32).

When it does not contain the CRC error, the CRC check circuit 212a sets "CRE=1" (step S33). When it contains the CRC error, the CRC check circuit 212a sets "CRE=0" (step S34).

Next, the processing in the first transfer period {P1b} will be described below.

The transmission interface [TXIF] of the semiconductor device 200 transmits a frame {FT5[n]}. The frame {FT5[n]} contains a check result (contents of the CRC error signal {CRE}) of the CRC check circuit 212a.

The reception interface {RXIF} of the semiconductor device 100 finishes receiving the frame {FT5[n]}, and waits for an event (step S41).

The control block 161 confirms the CRC error signal {CRE} (step S42).

The control block 161 changes the number of delay taps (Nt) on the basis of the CRC error signal {CRE}. When the CRC error occurs (the case of "CRE=1"), the control block 161 increments the number of delay taps (Nt) by one (Nt←Nt+1) to increase the delay of the clock line (step S43).

When the CRC error does not occur (the case of "CRE=0"), the control block 161 decrements the number of delay taps by one (Nt←Nt−1) to decrease the delay of the clock line (step S44). Thus, the control block 161 determines the number of delay taps not causing the CRC error, which is larger by one than the number of delay taps causing the CRC error. The number of delay taps is expressed as Ns.

A method of setting the number of delay taps by hold margin confirmation performed in the second period {P2a} and the second transfer period {P2b} will be described with reference to FIG. 15 and FIG. 16. FIG. 15 is a flowchart of processing in the second period. FIG. 16 is a flowchart of processing in the second transfer period.

First, the processing in the second period {P2a} will be first described.

The transmission interface {TXIF} of the semiconductor device 100 transmits a frame {FT1[n]}.

The reception interface {RXIF} of the semiconductor device 200 receives the frame {FT1[n]}, and waits for an event (step S51).

It is confirmed whether the frame {FT1[n]} can be received without the CRC error. That is, in the receiver 212, the reception data {RXD} is loaded into the register by the delay reception clock {RXC_D}. The CRC check circuit 212a checks whether the data loaded into the register contains the error (CRC error) (step S52).

When it does not contain the CRC error, the CRC check circuit 212a sets "CRE=1" (step S53). When it contains the CRC error, the CRC check circuit 212a sets "CRE=0" (step S54).

Next, the processing in the second transfer period {P2b} will be described below.

The transmission interface {TXIF} of the semiconductor device 200 transmits a frame {FT2[n]}. The frame {FT2[n]} contains a check result (contents of the CRC error signal {CRE}) of the CRC check circuit 212a.

The reception interface {RXIF} of the semiconductor device 100 finishes receiving the frame {FT2[n]}, and waits for an event (step S61).

The control block 162 confirms the CRC error signal {CRE} (step S62).

The control block 162 changes the number of delay taps (Nt) on the basis of the CRC error signal {CRE}. When the CRC error occurs (the case of "CRE=1"), the control block 162 decrements the number of delay taps (Nt) by one (Nt←Nt−1) to decrease the delay of the clock line (step S63).

When the CRC error does not occur (the case of "CRE=0"), the control block 162 increments the number of delay taps (Nt) by one (Nt←Nt+1) to increase the delay of the clock line (step S64).

Thus, the control block 162 determines the number of delay taps not causing the CRC error, which is smaller by one than the number of delay taps causing the CRC error. The number of delay taps is expressed as Nh.

The method of setting the number of delay taps in the third period {P3} will be described.

The number of delay taps found by the control block 161 in the first period {P1a} and the first transfer period {P1b} is expressed as Ns. The number of delay taps found by the control block 162 in the second period {P2a} and the second transfer period {P2b} is expressed as Nh. The arithmetic average between Ns and Nh calculated by the control block 163 is expressed as the number of delay taps (Nn) in the third period {P3} (Nn=(Ns+Nh)/2). Then, the normal frame is transmitted. That is, in the receiver 212 in the semiconductor device 200, the reception data {RXD} is loaded into the register by the delay reception clock {RXC_D} delayed by the delay adder circuit 150 having the number of delay taps set as Nn.

In the embodiment, in order to cancel a delay of the bidirectional (reception direction and transmission direction) PCB 300, the delay adder circuits 130 and 230 and the control circuits 140 and 240 for the reception clock are mounted on the semiconductor devices 100 and 200 targeted for the bidirectional communication, respectively. On the other hand, in the present modification example, the delay of the bidirectional PCB 300 can be cancelled even if the delay adder circuit 130 for the reception clock, the delay adder circuit 150 for the transmission clock, the control circuit 140, and the control circuit 160 are mounted on only one such as the semiconductor device 100 of the semiconductor devices.

Thus, the delay of the PCB on the bidirectional communication path can be canceled by replacement of only a newly added semiconductor device with the hardware corresponding to the present modification example without replacement with the hardware of the semiconductor device on the existing network system.

Second Modification Example

FIG. 17 is a block diagram of a configuration of semiconductor devices and a system using the same according to a second modification example.

In the first modification example, the semiconductor device 100 includes the control circuit 140 of the delay adder circuit 130 for the reception clock {RXC} and the control circuit 160 of the delay adder circuit 150 for the transmission clock {TXC}. On the other hand, in the second modification example, the semiconductor device 100 includes a CPU 170, an interrupt controller (INTC) 180, and registers (REG) 190r, 190t instead of the control circuits 140 and 160. The semiconductor device 100 further includes a memory configured to store programs or data to be executed by the CPU 170. A CPU, a memory, and an interrupt controller provided in the MCU may be used when the semiconductor device 100 is a MCU.

In the present modification example, the functions of the control circuits 140 and 160 according to the first modification example are performed by the CPU 170, the interrupt controller 180, and the registers 190r, 190t. Thus, the hardware can be easily designed.

The scheduler 114 supplies the control signal {b[1:0]} to the interrupt controller 180, and the interrupt controller 180 supplies an interrupt request based on the control signal {b[1:0]} to the CPU 170. The CPU 170 performs the similar processing to those of the control circuits 140 and 160 according to the first modification example on the basis of the interrupt request, the check result (CRC error signal {CRE}) of the CRC check circuit 212a from the receiver 112, and the check result (CRC error signal {CRE}) of the CRC check circuit 112a. The CPU 170 then outputs the number of delay taps to the registers 190r and 190t. Thus, the number of delay taps is set in the delay adder circuits 130 and 150.

In the foregoing, the disclosure made by the inventors of the present invention has been concretely described on the basis of the embodiments and modification examples. However, it is needless to say that the present disclosure is not limited to the foregoing embodiments and modification examples, and various modifications can be made within the scope of the present invention.

16

What is claimed is:

1. A semiconductor device comprising:
a communication device for wired communication;
a delay adder circuit capable of adjusting an amount of delay of a clock to be received or transmitted by the communication device; and
a control circuit controlling the amount of delay of the delay adder circuit,
wherein the communication device is configured to
set a reception period or a transmission period of a normal frame and a reception period or a transmission period of a check frame in time division, and
confirm timing margins of setup and hold between data and a clock in the reception period or the transmission period of the check frame,
wherein the control circuit is configured to set the amount of delay in the normal frame, based on a confirmation result of the timing margins,
wherein the control circuit is configured to
increment a first number of delay taps of the delay adder circuit when an error is detected in data to be received or transmitted in a first frame to confirm the setup margin in the check frame, and
decrement the first number of delay taps when the error is not detected in data to be received or transmitted in the first frame, and
wherein the control circuit is configured to
decrement a second number of delay taps of the delay adder circuit when the error is detected in data to be received or transmitted in a second frame to confirm the hold margin in the check frame, and
increment the second number of delay taps when the error is not detected in data to be received or transmitted in the second frame.

2. The semiconductor device according to claim 1,
wherein the communication device is configured to confirm the timing margins by checking whether an error occurs in data to be received or transmitted in the check frame.

3. The semiconductor device according to claim 1,
wherein the control circuit is configured to
calculate an arithmetic average between the first number of delay taps and the second number of delay taps, and
set the arithmetic average as the number of delay taps of the delay adder circuit in the normal frame.

4. The semiconductor device according to claim 3,
wherein the communication device is configured to generate a control signal indicating a period of time-divided periods, and
the control circuit is configured to perform generation of the first number of delay taps, generation of the second number of delay taps, or generation of the number of delay taps of the delay adder circuit in the normal frame, based on the control signal.

5. The semiconductor device according to claim 1,
wherein the communication device includes an error detection circuit for data to be received in the normal frame, and
the communication device is configured to detect the error in the first frame and the second frame by use of the error detection circuit.

6. The semiconductor device according to claim 5,
wherein the error detection circuit is a CRC check circuit in conformity with IEEE 802.3 standard.

7. The semiconductor device according to claim 1,
wherein the error of data to be transmitted in the first frame and the second frame is detected by use of an error detection circuit included in a semiconductor device of a communication party.

8. The semiconductor device according to claim 4, wherein the control circuit includes a control block configured of a plurality of pieces of hardware controlling the delay adder circuit, and a selector configured of hardware, and the delay adder circuit is controlled by the control block selected by the selector.

9. The semiconductor device according to claim 4, wherein the control circuit includes a CPU and a memory storing software to be executed by the CPU, and the delay adder circuit is controlled by the software executed by the CPU.

* * * * *

18